(12) United States Patent
Steckner

(10) Patent No.: US 6,255,820 B1
(45) Date of Patent: Jul. 3, 2001

(54) VARIABLE BANDWIDTH MRI DATA COLLECTION

(75) Inventor: Michael Steckner, Mayfield Heights, OH (US)

(73) Assignee: Picker International, Inc., HighlandHeights, OH (US)

(*) Notice: Subject to any disclaimer, the term of this patent is extended or adjusted under 35 U.S.C. 154(b) by 0 days.

(21) Appl. No.: 09/264,831

(22) Filed: Mar. 8, 1999

(51) Int. Cl.$^7$ .............................. G01V 3/00; G01R 33/20
(52) U.S. Cl. ................................. 324/309; 324/307
(58) Field of Search .................... 324/300–322

(56) References Cited

U.S. PATENT DOCUMENTS

| 4,859,945 | 8/1989 | Stokar | 324/309 |
|---|---|---|---|
| 4,952,876 | 8/1990 | Pelec | 324/309 |
| 5,349,292 | 9/1994 | Sugiura | 324/309 |
| 5,561,369 | 10/1996 | Feinberg et al. | |
| 5,602,476 | 2/1997 | Liu et al. | 324/309 |

FOREIGN PATENT DOCUMENTS

0759562A2  2/1997  (EP).

OTHER PUBLICATIONS

Schmitt et al., "Echo–Planar Imaging Theory, Technique, and application" Textbook pp. 80–85, Apr. 1998.*
David Feinberg, Ph.D., M.D., "Variable Encoding Time (VET)," ISMRM Conference, pp. 138–140, Oct. 27–29, 1997.
J.M. Pauly, et al. "A Circular Echo–Planar Pulse Sequence", Proceedings of the Society of Magnetic Resonance, vol. 1, Aug, 19–25, 1995, p. 106 XP002140257.
Feinberg, D.A. "Vet Imaging: Magnetic Resonance Imaging With Variable Encoding Time", Magnetic Resonance in Medicine, US, Academic Press, Duluth, MN, vol. 38, No. 1, Jul. 1, 1997 ISSN: 0740–3194.

* cited by examiner

Primary Examiner—Christine Oda
Assistant Examiner—Tiffany A. Fetzner
(74) Attorney, Agent, or Firm—Fay, Sharpe, Fagan, Minnich & McKee, LLP

(57) ABSTRACT

The present invention is directed to an MRI apparatus. It includes a main magnet 12 that generates a substantially uniform temporally constant main magnetic field, $B_0$, through an examination region 14 wherein an object being imaged is positioned. A magnetic gradient generator produces magnetic gradients in the main magnetic field across the examination region 14. A transmission system includes an RF transmitter 24 that drives an RF coil 26 which is proximate to the examination region 14. A sequence control 40 manipulates the magnetic gradient generator and the transmission system to produce an MRI pulse sequence, such as an FSE pulse sequence. The MRI pulse sequence induces magnetic resonance echos 66 from the object. A reception system includes a receiver 30 that receives and demodulates the echos 66 at varying sample rates and varying bandwidths. A reconstruction processor 50 reconstructs a single image from data collected via the reception system, and an output device produces a human viewable rendering of the image.

18 Claims, 3 Drawing Sheets

VARIABLE BANDWIDTH MRI DATA COLLECTION

BACKGROUND OF THE INVENTION

The present invention relates to the art of medical diagnostic imaging. It finds particular application in conjunction with magnetic resonance imaging (MRI), and will be described with particular reference thereto. However, it is to be appreciated that the present invention is also amenable to other like applications.

In MRI, a substantially uniform temporally constant main magnetic field, $B_0$, is generated within an examination region. The main magnetic field polarizes the nuclear spin system of a subject being imaged within the examination region. Magnetic resonance is excited in dipoles which align with the magnetic field by transmitting radio frequency (RF) excitation signals into the examination region. Specifically, RF pulses transmitted via an RF coil assembly tip the dipoles out of alignment with the main magnetic field and cause a macroscopic magnetic moment vector to precess around an axis parallel to the main magnetic field. The precessing magnetic moment, in turn, generates a corresponding RF magnetic resonance signal as it relaxes and returns to its former state of alignment with the main magnetic field. The RF magnetic resonance signal is received by the RF coil assembly, and from received signals, an image representation is reconstructed for display on a human viewable display.

The appropriate frequency for exciting resonance in selected dipoles is governed by the Larmor equation. That is to say, the precession frequency of a dipole in a magnetic field, and hence the appropriate frequency for exciting resonance in that dipole, is a product of the gyromagnetic ratio γ of the dipole and the strength of the magnetic field. In a 1.5 T magnetic field, hydrogen ($^1$H) dipoles have a resonance frequency of approximately 64 MHz. Generally in MRI, the hydrogen species is excited because of its abundance and because it yields a strong MR signal. As a result, typical MRI apparatus are equipped with built-in whole-body RF coils tuned to the resonant frequency for hydrogen.

One obstacle to overcome in MRI is potential degradation in the image reconstruction due a low signal to noise ratio (SNR) in the acquired MR signals or echos.

Previously developed methods employed to address the SNR problem have had generally limited success due to various drawbacks. Some multi-echo sequences decrease the bandwidth of data collection for each echo in succession such that the later echos, which are of a lower amplitude due to MR signal decay, are collected at a lower bandwidth to preserve SNR as best as possible. One example is multi-echo spin echo sequences which provide different contrasts in a set of images built each in turn from one of the echos. However, these techniques do not vary the bandwidth of data collection within a single image. Additionally, the SNR remains degraded by the noise accompanying data from the corners of k-space which are not fully visualized in the image.

Normally, a number of rows or horizontal lines with a predetermined number of sample points are collected for an MR image. This raw data often fills k-space in a rectangular or square shape. Employment of a circular Fermi filter applied to the raw MR data to chop off the corners of k-space has been shown to improve SNR by as much as 13%. However, the disadvantage associated with this technique is that resources are wasted on the collection of data which is ultimately discarded.

There is also the variable encoding time (VET) method. Recognizing that central lines of k-space generally employ less phase encoding as compared to the outer lines, the VET method shortens the inter-echo spacing of a sequence while varying the data sampling window. By shortening the data sampling window time and preserving the same sampling bandwidth, time is made available for larger phase encode lobes, or the time is made available for more data samples when the desired phase encode amounts are low. This allows for the trimming of k-space corners.

The present invention contemplates a new and improved data collection technique which overcomes the above-referenced problems and others.

SUMMARY OF THE INVENTION

In accordance with one aspect of the present invention, a method of MRI data collection with multiple data acquisitions for a single image reconstruction is provided. It includes initiating an MRI pulse sequence and collecting MRI data from a first resulting echo at a first sample rate and bandwidth. Thereafter, the sample rate and bandwidth are varied such that they are set to a new sample rate and bandwidth. MRI data is then collected from a next resulting echo at the new sample rate and bandwidth. The steps of varying the bandwidth and sample rate and collection of resulting echos are repeated for consecutive echos until a desired amount of MRI data is collected. Ultimately, an image representation is reconstructed from the collected MRI data.

In accordance with a more limited aspect of the present invention, variations in the sample rate and bandwidth are such that a total collection time for each echo remains substantially constant.

In accordance with a more limited aspect of the present invention, the collection of MRI data is conducted with a fixed duration window such that varying the sample rate varies a number of data points sampled.

In accordance with a more limited aspect of the present invention, collected MRI data from the first echo is mapped to a central line of k-space.

In accordance with a more limited aspect of the present invention, later collected MRI data from subsequent echos are progressively mapped to outer lines of k-space.

In accordance with a more limited aspect of the present invention, the bandwidth is varied such that it is progressively made narrower.

In accordance with a more limited aspect of the present invention, the number of data points sampled decreases as progressively outer lines of k-space are mapped such that a circular shaped area of k-space is filled.

In accordance with a more limited aspect of the present invention, the MRI pulse sequence is selected from a group consisting of a GSE sequence, a FSE sequence, and a single shot FSE sequence.

In accordance with a more limited aspect of the present invention, the bandwidth is varied by changing an amplitude of a read gradient so that a predetermined FOV is maintained.

In accordance with a more limited aspect of the present invention, the bandwidth selected for each echo is determined based on the echo's relative signal strength such that lower signal strengths correspond to lower selected bandwidths.

In accordance with another aspect of the present invention, an MRI apparatus is provided. It includes a main magnet that generates a substantially uniform temporally constant main magnetic field through an examination region wherein an object being imaged is positioned. A magnetic gradient generator produces magnetic gradients in the main magnetic field across the examination region. A transmission system includes an RF transmitter that drives an RF coil which is proximate to the examination region. A sequence control manipulates the magnetic gradient generator and the transmission system to produce an MRI pulse sequence. The MRI pulse sequence induces magnetic resonance echos from the object. A reception system includes a receiver that receives and demodulates the echos at varying sample rates and varying bandwidths. A reconstruction processor reconstructs a single image from data collected via the reception system, and an output device produces a human viewable rendering of the image.

In accordance with a more limited aspect of the present invention, variations in the sample rate and variations in the bandwidth are such that a total collection time for each echo remains substantially constant.

In accordance with a more limited aspect of the present invention, reception of each echo is conducted with a fixed duration window such that variations in sample rate translate to variations in number of data points sampled.

In accordance with a more limited aspect of the present invention, multiple acquisitions from one echo train are used together in reconstruction of one image.

In accordance with a more limited aspect of the present invention, the MRI pulse sequence is selected from a group consisting of a GSE sequence, a FSE sequence, and a single shot FSE sequence.

In accordance with a more limited aspect of the present invention, the bandwidth is varied by changing an amplitude of a read gradient applied via the magnetic gradient generator so that a predetermined FOV is maintained.

In accordance with a more limited aspect of the present invention, the bandwidth selected for each echo is determined based on the echo's relative signal strength such that lower signal strengths correspond to lower selected bandwidths.

In accordance with a more limited aspect of the present invention, the bandwidth selected for each echo is determined based on the echo's ultimate position in k-space.

One advantage of the present invention is that it improves the SNR in MRI.

Another advantage of the present invention is its efficient use of scan times.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
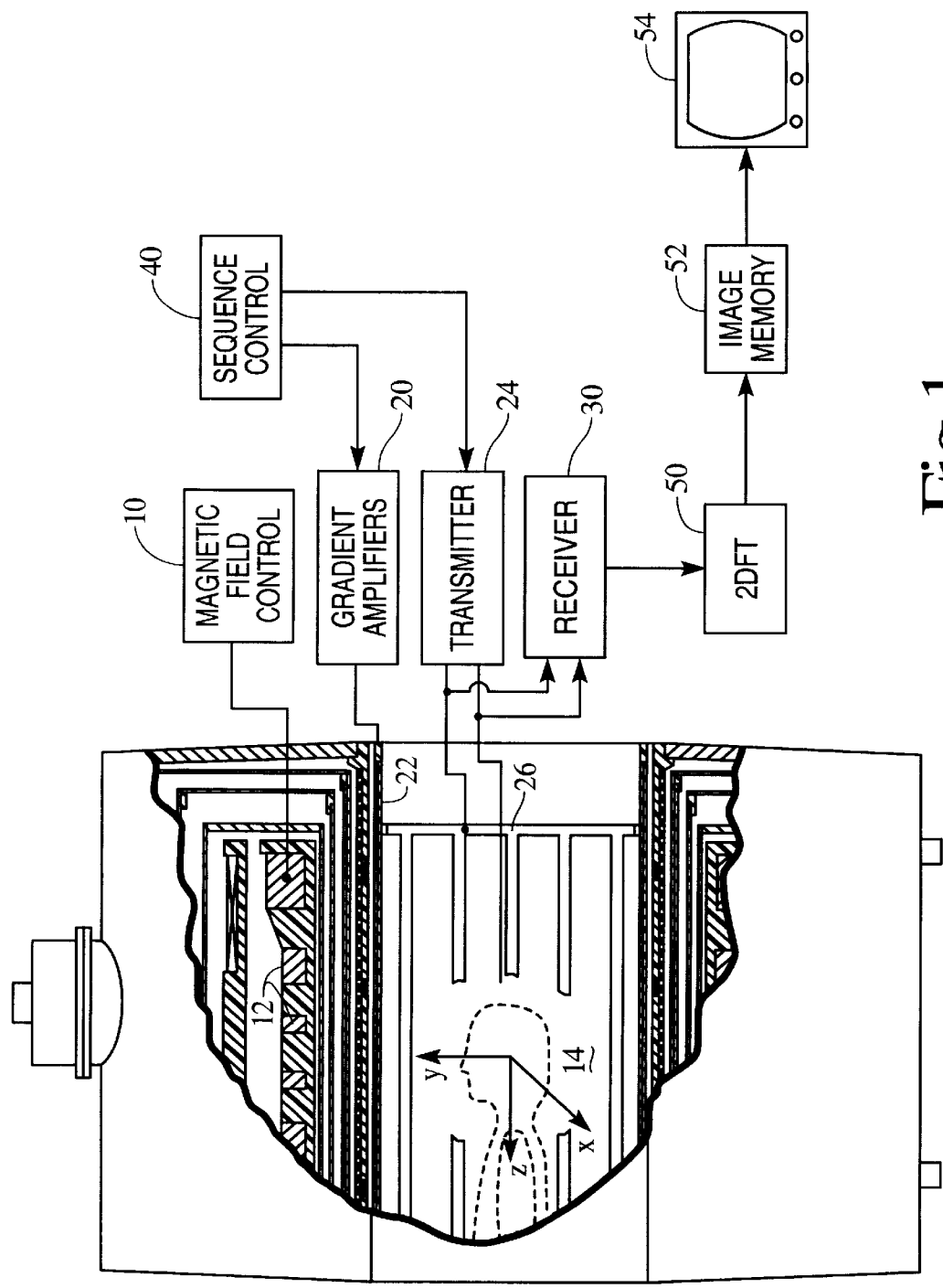
FIG. 1 is a diagrammatic illustration of an MRI apparatus in accordance with aspects of the present invention.

With reference to FIG. 1, a main magnetic field control 10 controls superconducting or resistive magnets 12 such that a substantially uniform temporally constant main magnetic field, $B_0$, is created along a z axis through an examination region 14. A couch (not illustrated) suspends and/or positions an object to be examined, such as a patient or phantom, within the examination region 14. A magnetic resonance echo means applies a series of RF and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging sequences. More specifically, gradient pulse amplifiers 20 apply current pulses to selected ones or pairs of gradient coil assemblies 22 to create magnetic field gradients along x, y, and z axes of the examination region 14. A digital RF transmitter 24 drives a whole-body RF coil 26 to transmit RF pulses or pulse packets into the examination region 14. A typical RF pulse is composed of a packet of immediately contiguous pulse segments of short duration, which taken together with each other and any applied gradients, achieve a selected magnetic resonance manipulation. For whole-body applications, the resonance signals or echos are commonly picked up by the whole-body RF coil 26.

For generating images of local regions of the subject, specialized RF coils are placed contiguous to the selected region of interest. For example, an insertable RF coil may be inserted surrounding a selected region at the isocenter of the bore. The insertable RF coil is used to excite magnetic resonance and receive magnetic resonance signals emitting from the patient in the region being examined. Alternatively, the insertable RF coil can be used to only receive resonance signals introduced by the wholebody RF coil 26. In any event, the resultant RF signals are picked up by the whole-body RF coil 26, the insertable RF coil, or other specialized RF coil and demodulated by a receiver 30, preferably a digital receiver.

A sequence control circuit 40 controls the gradient pulse amplifiers 20 and the transmitter 24 to generate any of a plurality of multiple echo sequences such as gradient and spin echo (GSE) imaging, fast spin echo (FSE) imaging, single shot FSE imaging, and the like. For the selected sequence, the receiver 30 receives a plurality of data lines in rapid succession following each RF excitation pulse. Ultimately, the RF signals are received, demodulated, and reconstructed into an image representation by a reconstruction processor 50 which applies a two-dimensional (2D) Fourier transform or other appropriate reconstruction algorithm. The image may represent a planar slice through the patient, an array of parallel planar slices, a three-dimensional volume, or the like. The image is then stored in an image memory 52 where it is accessed by a display, such as a video monitor 54 or other human viewable display or output device that provides a rendering of the resultant image.

While the invention herein is described with reference to the MRI apparatus detailed above, it is appreciated that the invention is applicable to other MRI apparatus. For example, the invention is equally amenable to open geometry magnets wherein opposing pole pieces, joined by a ferrous flux return path, define an examination region therebetween.

Figure 2:
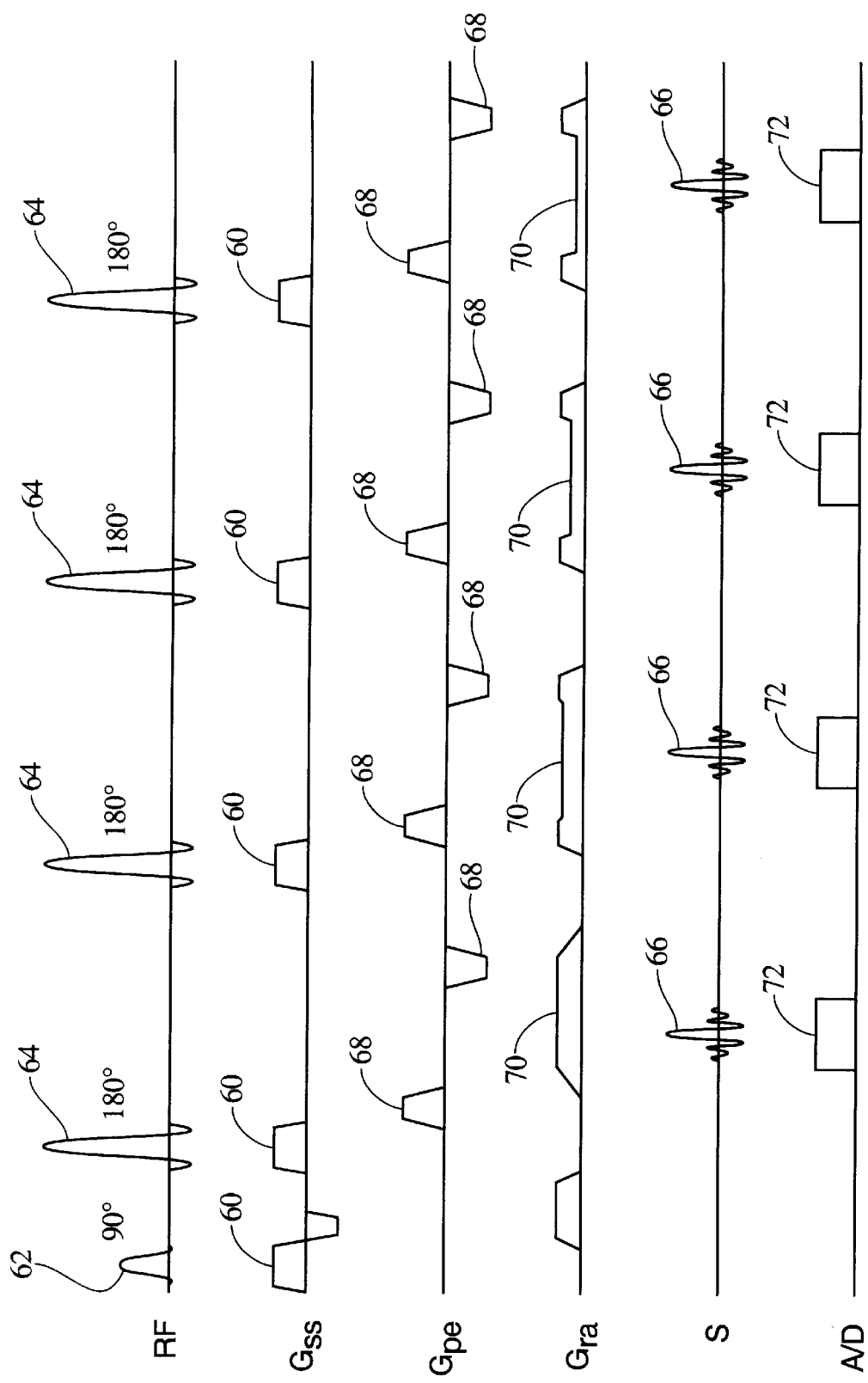
FIG. 2 is a diagrammatic illustration of an MRI pulse sequence in accordance with aspects of the present invention; and, FIG. 3 is a diagrammatic illustration of k-space in accordance with aspects of the present invention.

In any event, with reference to FIG. 2 and continuing reference to FIG. 1, the sequence control 40 initiates and directs an MRI pulse sequence that generates the signal received by the receiver 30. For purposes of illustration herein, the MRI pulse sequence is assumed to be a FSE sequence. However, a single shot FSE sequence, a GSE sequence, or the like may also be employed. For each image reconstructed, during the application of separate slice select gradients 60 to the gradient coil assembly 22, a series of RF pulses are applied to the RF coil 26 via the RF transmitter 24. In the exemplary FSE sequence, the RF pulses include an initial 90° flip angle resonance exciting RF pulse 62 followed by a series of 180° flip angle refocusing RF pulses 64. The application of each refocusing pulse 64 results in an echo 66. Collectively the echos 66 make up the echo train of the signal. Each echo 66 is phase encoded by applying, to the gradient coil assembly 22, a phase encode gradient pulse 68 preceding and following each echo 66. The individual echos 66 are separately phase encoded by varying the amplitude and/or duration of the phase encoding gradient pulse 68. Each echo 66 is then collected under a readout gradient pulse 70 applied to the gradient coil assembly 22. The profile of the readout gradient pulses 70 includes a central amplitude that varies between echos 66, and extra lobes at either end. This profile is constructed so that the echos 66 are collected under readout gradients of different amplitudes while the total area under each readout gradient pulse 70 is kept the same between each refocusing RF pulse 64. In any event, the receiver 30 collects and/or samples the echos 66 under a fix duration sampling window 72.

Figure 3:
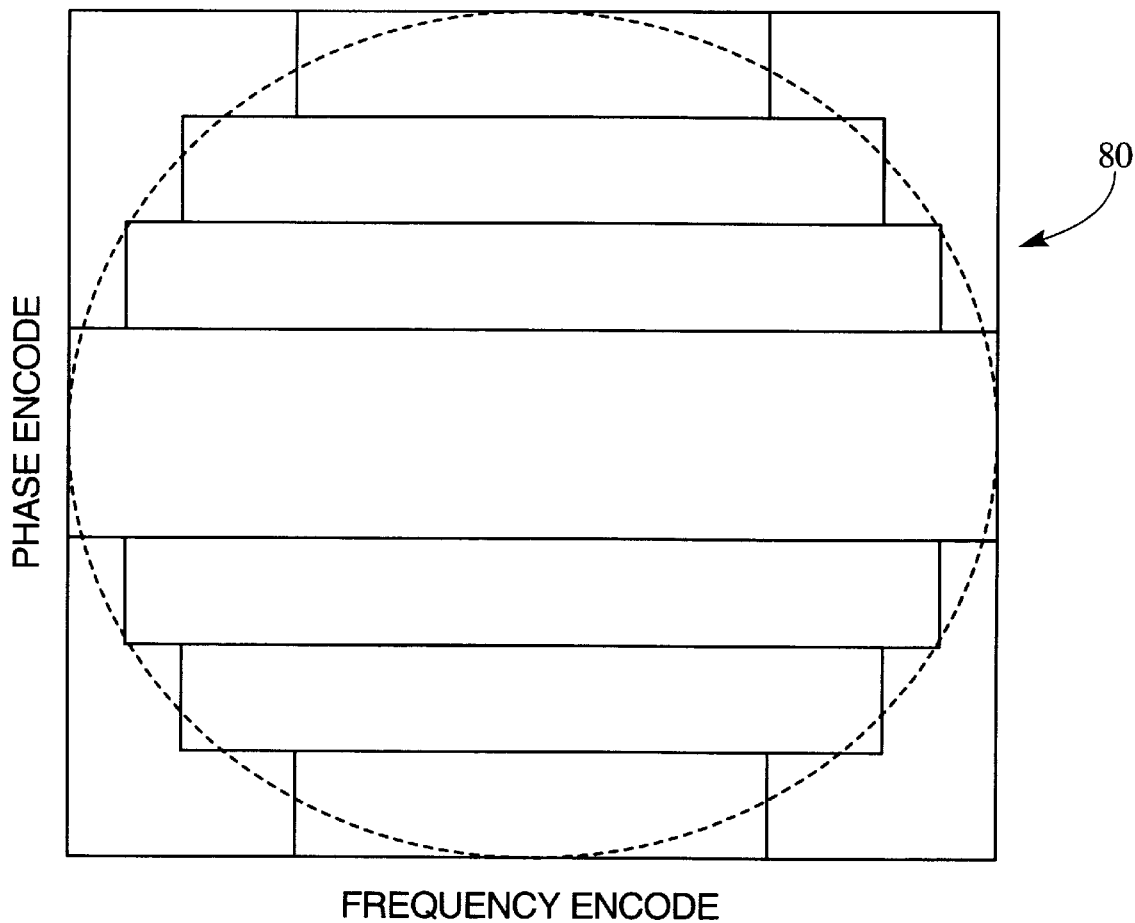

With reference to FIG. 3 and continuing reference to FIGS. 1 and 2, as each echo 66 is collected and/or sampled by the receiver 30, the raw MR data is loaded into a memory matrix otherwise known as k-space 80. It is this raw data in k-space 80 that is the object of the 2D Fourier transform or other appropriate reconstruction algorithm carried out by the reconstruction processor 50. Each of the collected echos 66 is mapped into its own corresponding row or horizontal line of k-space 80 such that each successively sampled data value occupies successive columns. The row each echo 66 is assigned to is based on the particular phase encoding imparted thereto via the phase encoding gradient pulses 68. Optionally, in a preferred embodiment, a first collected echo 66 is mapped to a central line of k-space 80 while successively collected echos 66 are mapped to further out neighboring lines of k-space 80 in a progressive manner.

The collected echos 66 have variable bandwidths and are sampled at a variable sampling rate. The variable bandwidths are achieved by regulating the amplitude of the readout gradient pulses 70 applied to the gradient coil assembly 22 such that a desired field of view (FOV) is maintained for each echo 66. In the illustrated pulse sequence, the echos 66 are sampled at progressively narrower bandwidths under readout gradient pulses 70 having progressively smaller amplitudes during echo collection. In this manner, the later echos 70 in the echo train which typically have lower signal strengths are sampled at the lower bandwidths thereby improving their SNR.

Additionally, the echos 66 are collected at variable sampling rates. Being that the sampling window 72 has a fixed duration, the result is a variable number of data samples for each of the echos 66. In a preferred embodiment, the sampling rate (and hence the number of data points sampled) is varied such that as successive lines of k-space 80 are filled, the filled area of k-space 80 takes a circular shape. That is to say, the relationship between the phase encoding imparted by the phase encoding gradient pulses 68 and the sampling rate is such that a circular area of k-space 80 is filled with sampled data values. To achieve the circular shape, phase encoded lines assigned more toward a center of k-space 80 have a relatively higher sampling rate such that more data points are collected within the fixed duration sampling window 72. The relatively higher number data samples in turn results in relatively longer data lines.

As the data lines grow progressively shorter toward the edges of k-space 80, the filled portion of k-space 80 take on the shape of a circle. In this manner, similar to the application of a Fermi filter, the SNR is improved by eliminating the corners of k-space 80 which are not fully visualized in the image reconstruction. Alternately, as opposed to a circle, other desired shapes are employed such as, for example, an elliptical shape.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method of magnetic resonance imaging comprising:
   (a) initiating an MRI pulse sequence resulting in a plurality of echos;
   (b) collecting MRI data from one of the plurality of echos at a first sample rate and bandwidth;
   (c) varying the sample rate and bandwidth such that they are set to a new sample rate and bandwidth while maintaining substantially the same collection time;
   (d) collecting MRI data from another of the plurality of echos at the new sample rate and bandwidth;
   (e) repeating steps (c) and (d) for the plurality of echos until a desired amount of MRI data is collected; and,
   (f) reconstructing a single image representation from the MRI data collected at varying sample rates and bandwidths.

2. A method of MRI data collection comprising:
   (a) initiating an MRI pulse sequence resulting in a plurality of echos;
   (b) collecting MRI data from one of the plurality of echos at a first sample rate and bandwidth;
   (c) varying the sample rate and bandwidth so that they are set to a new sample rate and bandwidth, wherein a total collection time for each echo remains substantially constant;
   (d) collecting MRI data from another of the plurality of echos at the new sample rate and bandwidth;
   (e) repeating steps (c) and (d) until a desired amount of MRI data is collected; and,
   (f) reconstructing an image representation from the collected MRI data.

3. The method according to claim 2, wherein the collection of MRI data is conducted with a fixed duration window such that varying the sample rate varies a number of data points sampled.

4. The method according to claim 3, wherein collected MRI data from a first of the plurality of echos is mapped to a central line of k-space.

5. The method according to claim 4, wherein later collected MRI data from echos subsequent to the first are progressively mapped to outer lines of k-space.

6. The method according to claim 5, wherein the bandwidth is varied such that it is progressively made narrower.

7. The method according to claim 6, wherein the number of data points sampled decreases as progressively outer lines of k-space are mapped such that a circular shaped area of k-space is filled.

8. The method according to claim 1, wherein the MRI pulse sequence is selected from a group consisting of a GSE sequence, a FSE sequence, and a single shot FSE sequence.

9. The method according to claim 1, wherein the bandwidth is varied by changing an amplitude of a read gradient so that a predetermined FOV is maintained.

10. The method according to claim 1, wherein the bandwidth selected for each echo is determined based on the echo's relative signal strength such that lower signal strengths correspond to lower selected bandwidths.

11. An MRI apparatus comprising:

a main magnet that generates a substantially uniform temporally constant main magnetic field through an examination region wherein an object being imaged is positioned;

a magnetic gradient generator that produces magnetic gradients in the main magnetic field across the examination region;

a transmission system which includes an RF transmitter that drives an RF coil which is proximate to the examination region;

a sequence control which manipulates the magnetic gradient generator and the transmission system to produce an MRI pulse sequence, said MRI pulse sequence inducing magnetic resonance echos from the object, said echos having varying bandwidths;

a reception system which includes a receiver that receives and demodulates the echos such that a varying number of data points are collected for each echo;

a reconstruction processor that reconstructs a single image using data collected via the reception system from echos having varying bandwidths; and, an output device that produces a human viewable rendering of the image.

12. An MRI apparatus which induces magnetic resonance echos from an object being imaged, said MRI apparatus comprising:

a reception system which includes a receiver that receives and demodulates the echos at varying sample rates and varying bandwidths, wherein a total collection time for each echo remains substantially constant; and, a reconstruction processor that reconstructs a single image from echos having varying sample rates and varying bandwidths.

13. An MRI apparatus which induces magnetic resonance echos from an object being imaged, said MRI apparatus comprising:

a reception system which includes a receiver that receives and demodulates the echos at varying sample rates and varying bandwidths, wherein reception of each echo is conducted with a fixed duration window such that variations in sample rate translate to variations in number of data points sampled; and, a reconstruction processor that reconstructs a single image from echos having varying sample rates and varying bandwidth.

14. The MRI apparatus according to claim 11, wherein multiple acquisitions from one echo train are used together in reconstruction of one image.

15. The MRI apparatus according to claim 14, wherein the MRI pulse sequence is selected from a group consisting of a GSE sequence, a FSE sequence, and a single shot FSE sequence.

16. The MRI apparatus according to claim 11, wherein the bandwidth is varied by changing an amplitude of a read gradient applied via the magnetic gradient generator so that a predetermined FOV is maintained.

17. The MRI apparatus according to claim 11, wherein the bandwidth selected for each echo is determined based on the echo's relative signal strength such that lower signal strengths correspond to lower selected bandwidths.

18. The MRI apparatus according to claim 11, wherein the bandwidth selected for each echo is determined based on the echo's ultimate position in k-space.

\* \* \* \* \*